US012612303B2

(12) United States Patent
Zhang et al.

(10) Patent No.: US 12,612,303 B2
(45) Date of Patent: Apr. 28, 2026

(54) STRESS ISOLATION FOR INTEGRATED CIRCUIT PACKAGE INTEGRATION

(71) Applicant: Analog Devices, Inc., Wilmington, MA (US)

(72) Inventors: Xin Zhang, Acton, MA (US); Jianglong Zhang, Vienna, VA (US); Li Chen, Belmont, MA (US); John C. Cowles, Beaverton, OR (US); Michael Judy, Ipswich, MA (US); Shafi Saiyed, Lynnfield, MA (US)

(73) Assignee: Analog Devices, Inc., Wilmington, MA (US)

( * ) Notice: Subject to any disclaimer, the term of this patent is extended or adjusted under 35 U.S.C. 154(b) by 527 days.

(21) Appl. No.: 18/100,846

(22) Filed: Jan. 24, 2023

(65) Prior Publication Data

US 2023/0234835 A1      Jul. 27, 2023

Related U.S. Application Data

(60) Provisional application No. 63/303,013, filed on Jan. 25, 2022.

(51) Int. Cl.
B81B 7/00          (2006.01)
B81C 1/00          (2006.01)
          (Continued)

(52) U.S. Cl.
CPC ............ B81B 7/0048 (2013.01); B81B 7/008 (2013.01); B81C 1/00666 (2013.01);
          (Continued)

(58) Field of Classification Search
CPC . B81B 7/0048; B81B 7/008; B81B 2207/012; B81B 2207/096;
          (Continued)

(56) References Cited

U.S. PATENT DOCUMENTS 3,839,660  A      10/1974  Stryker
4,492,825  A      1/1985  Brzezinski et al.
          (Continued)

FOREIGN PATENT DOCUMENTS

CN          118591880  A      9/2024
CN          118660860  A      9/2024
          (Continued)

OTHER PUBLICATIONS

[No Author Listed], Department of Defense. Test Method Standard Microcircuits, FSC 5962, completed 1997.
          (Continued)

*Primary Examiner* — Dao H Nguyen
(74) *Attorney, Agent, or Firm* — Knobbe, Martens, Olson & Bear, LLP

(57)          ABSTRACT

Packaging of microfabricated devices, such as integrated circuits, microelectromechanical systems (MEMS), or sensor devices is described. The packaging is 3D heterogeneous packaging in at least some embodiments. The 3D heterogeneous packaging includes an interposer. The interposer includes stress relief platforms. Thus, stresses originating in the packaging do not propagate to the packaged device. A stress isolation platform is an example of a stress relief feature. A stress isolation platform includes a portion of an interposer coupled to the remainder of the interposer via stress isolation suspensions. Stress isolation suspensions can be formed by etching trenches through the interposer.

20 Claims, 12 Drawing Sheets

(51) Int. Cl.
*H10W 42/00* (2026.01)
*H10W 70/60* (2026.01)
*H10W 70/63* (2026.01)
*H10W 90/00* (2026.01)

(52) U.S. Cl.
CPC ........ *H10W 42/121* (2026.01); *H10W 70/611* (2026.01); *H10W 70/635* (2026.01); *H10W 90/00* (2026.01); *H10W 90/401* (2026.01)

(58) Field of Classification Search
CPC ........... B81C 1/00666; B81C 1/00238; H10W 42/121; H10W 70/611; H10W 70/635; H10W 90/00; H10W 90/401; H10W 90/26; H10W 90/297; H10W 90/722; H10W 90/724; H10W 90/701; H10W 72/823
See application file for complete search history.

(56) References Cited

U.S. PATENT DOCUMENTS

| | | | |
|---|---|---|---|
| 4,524,247 A | 6/1985 | Lindenberger et al. |
| 4,533,795 A | 8/1985 | Baumhauer, Jr. et al. |
| 4,558,184 A | 12/1985 | Bch-Vishniac et al. |
| 4,710,744 A | 12/1987 | Wamstad |
| 4,740,410 A | 4/1988 | Muller et al. |
| 4,744,863 A | 5/1988 | Guckel et al. |
| 4,776,019 A | 10/1988 | Miyatake |
| 4,800,758 A | 1/1989 | Knecht et al. |
| 4,825,335 A | 4/1989 | Wilner |
| 4,853,669 A | 8/1989 | Guckel et al. |
| 4,872,047 A | 10/1989 | Fister et al. |
| 4,918,032 A | 4/1990 | Jain et al. |
| 4,948,757 A | 8/1990 | Jain et al. |
| 4,996,082 A | 2/1991 | Guckel et al. |
| 5,067,007 A | 11/1991 | Otsuka et al. |
| 5,090,254 A | 2/1992 | Guckel et al. |
| 5,105,258 A | 4/1992 | Silvis et al. |
| 5,113,466 A | 5/1992 | Acarlar et al. |
| 5,146,435 A | 9/1992 | Bernstein |
| 5,172,213 A | 12/1992 | Zimmerman |
| 5,178,015 A | 1/1993 | Loeppert et al. |
| 5,188,983 A | 2/1993 | Guckel et al. |
| 5,207,102 A | 5/1993 | Takahashi et al. |
| 5,241,133 A | 8/1993 | Mullen, III et al. |
| 5,273,939 A | 12/1993 | Becker et al. |
| 5,303,210 A | 4/1994 | Bernstein |
| 5,314,572 A | 5/1994 | Core et al. |
| 5,315,155 A | 5/1994 | O'Donnelly et al. |
| 5,317,107 A | 5/1994 | Osorio |
| 5,336,928 A | 8/1994 | Neugebauer et al. |
| 5,452,268 A | 9/1995 | Bernstein |
| 5,468,999 A | 11/1995 | Lin et al. |
| 5,490,220 A | 2/1996 | Loeppert |
| 5,515,732 A | 5/1996 | Willcox et al. |
| 5,593,926 A | 1/1997 | Fujihira |
| 5,596,222 A | 1/1997 | Bernstein |
| 5,608,265 A | 3/1997 | Kitano et al. |
| 5,629,566 A | 5/1997 | Doi et al. |
| 5,633,552 A | 5/1997 | Lee et al. |
| 5,658,710 A | 8/1997 | Neukermans |
| 5,684,324 A | 11/1997 | Bernstein |
| 5,692,060 A | 11/1997 | Wickstrom |
| 5,740,261 A | 4/1998 | Loeppert et al. |
| 5,828,127 A | 10/1998 | Yamagata et al. |
| 5,870,482 A | 2/1999 | Loeppert et al. |
| 5,901,046 A | 5/1999 | Ohta et al. |
| 5,923,995 A | 7/1999 | Kao et al. |
| 5,939,633 A | 8/1999 | Judy |
| 5,945,605 A | 8/1999 | Julian et al. |
| 5,956,292 A | 9/1999 | Bernstein |
| 5,960,093 A | 9/1999 | Miller |
| 5,994,161 A | 11/1999 | Bitko et al. |
| 6,050,832 A * | 4/2000 | Lee ........................ H05K 3/326 |
| | | 439/91 |

| | | | |
|---|---|---|---|
| 6,084,292 A | 7/2000 | Shinohara |
| 6,128,961 A | 10/2000 | Haronian |
| 6,147,397 A | 11/2000 | Burns et al. |
| 6,169,328 B1 | 1/2001 | Mitchell et al. |
| 6,243,474 B1 | 6/2001 | Tai et al. |
| 6,249,075 B1 | 6/2001 | Bishop et al. |
| 6,309,915 B1 | 10/2001 | Distefano |
| 6,329,706 B1 | 12/2001 | Nam |
| 6,384,472 B1 | 5/2002 | Huang |
| 6,384,473 B1 | 5/2002 | Peterson et al. |
| 6,401,545 B1 | 6/2002 | Monk et al. |
| 6,432,737 B1 | 8/2002 | Webster |
| 6,433,401 B1 | 8/2002 | Clark et al. |
| 6,505,511 B1 | 1/2003 | Geen et al. |
| 6,522,762 B1 | 2/2003 | Mullenborn et al. |
| 6,535,460 B2 | 3/2003 | Loeppert et al. |
| 6,548,895 B1 | 4/2003 | Benavides et al. |
| 6,552,469 B1 | 4/2003 | Pederson et al. |
| 6,617,683 B2 | 9/2003 | Lebonheur et al. |
| 6,667,189 B1 | 12/2003 | Wang et al. |
| 6,667,557 B2 | 12/2003 | Alcoe et al. |
| 6,677,176 B2 | 1/2004 | Wong et al. |
| 6,704,427 B2 | 3/2004 | Kearey |
| 6,711,317 B2 | 3/2004 | Jin et al. |
| 6,731,180 B1 | 5/2004 | Clark et al. |
| 6,732,588 B1 | 5/2004 | Mullenborn et al. |
| 6,741,709 B2 | 5/2004 | Kay et al. |
| 6,753,583 B2 | 6/2004 | Stoffel et al. |
| 6,768,196 B2 | 7/2004 | Harney et al. |
| 6,781,231 B2 | 8/2004 | Minervini |
| 6,812,620 B2 | 11/2004 | Scheeper et al. |
| 6,816,301 B1 | 11/2004 | Schiller |
| 6,821,819 B1 | 11/2004 | Benavides et al. |
| 6,829,131 B1 | 12/2004 | Loeb et al. |
| 6,847,090 B2 | 1/2005 | Loeppert |
| 6,857,312 B2 | 2/2005 | Choe et al. |
| 6,859,542 B2 | 2/2005 | Johannsen et al. |
| 6,914,992 B1 | 7/2005 | van Halteren et al. |
| 6,955,988 B2 | 10/2005 | Nevin et al. |
| 6,984,886 B2 | 1/2006 | Ahn et al. |
| 7,066,004 B1 | 6/2006 | Kohler |
| 7,088,032 B2 | 8/2006 | Oita et al. |
| 7,166,911 B2 | 1/2007 | Karpman et al. |
| 7,215,213 B2 | 5/2007 | Mescher et al. |
| 7,268,463 B2 | 9/2007 | Li et al. |
| 7,309,865 B2 | 12/2007 | Ikushima et al. |
| 7,551,048 B2 | 6/2009 | Iwata et al. |
| 7,839,052 B2 | 11/2010 | Wu et al. |
| 7,871,865 B2 | 1/2011 | Sengupta et al. |
| 7,920,770 B2 | 4/2011 | Holzwarth et al. |
| 8,049,326 B2 | 11/2011 | Najafi et al. |
| 8,103,027 B2 | 1/2012 | Zhang et al. |
| 8,217,474 B2 | 7/2012 | Lee et al. |
| 8,319,338 B1 | 11/2012 | Berry et al. |
| 8,344,487 B2 | 1/2013 | Zhang et al. |
| 8,476,737 B2 | 7/2013 | Najafi et al. |
| 8,671,752 B2 | 3/2014 | Hoefer et al. |
| 8,698,292 B2 | 4/2014 | Najafi et al. |
| 8,906,730 B2 | 12/2014 | Graham et al. |
| 9,067,778 B2 | 6/2015 | Classen et al. |
| 9,106,229 B1 | 8/2015 | Hutton et al. |
| 9,184,138 B2 | 11/2015 | Merassi et al. |
| 9,227,835 B2 | 1/2016 | Horning et al. |
| 9,422,156 B2 | 8/2016 | Smeys |
| 9,926,188 B2 | 3/2018 | Classen et al. |
| 10,131,538 B2 | 11/2018 | Kaanta et al. |
| 10,167,189 B2 | 1/2019 | Zhang et al. |
| 10,759,659 B2 | 9/2020 | Zhang et al. |
| 11,417,611 B2 | 8/2022 | Fitzgerald et al. |
| 11,693,020 B2 | 7/2023 | Samuelson et al. |
| 2001/0055836 A1 | 12/2001 | Kunda |
| 2002/0102004 A1 | 8/2002 | Minervini |
| 2002/0125559 A1 | 9/2002 | Mclellan |
| 2003/0016839 A1 | 1/2003 | Loeppert et al. |
| 2003/0133588 A1 | 7/2003 | Pedersen |
| 2003/0189222 A1 | 10/2003 | Itou et al. |
| 2004/0041254 A1 | 3/2004 | Long et al. |
| 2004/0056337 A1 | 3/2004 | Hasebe et al. |
| 2004/0070056 A1 | 4/2004 | Matsuzawa et al. |

(56) References Cited

U.S. PATENT DOCUMENTS

| | | |
|---|---|---|
| 2004/0164424 A1 | 8/2004 | Silverbrook |
| 2004/0179705 A1 | 9/2004 | Wang et al. |
| 2004/0184632 A1 | 9/2004 | Minervini |
| 2004/0184633 A1 | 9/2004 | Kay et al. |
| 2004/0262781 A1 | 12/2004 | Germain et al. |
| 2005/0005421 A1 | 1/2005 | Wang et al. |
| 2005/0018864 A1 | 1/2005 | Minervini |
| 2005/0089188 A1 | 4/2005 | Feng |
| 2005/0093117 A1 | 5/2005 | Masuda et al. |
| 2005/0178208 A1 | 8/2005 | Benzel et al. |
| 2006/0246630 A1 | 11/2006 | Sunohara et al. |
| 2007/0016023 A1 | 1/2007 | Phelps et al. |
| 2007/0040231 A1 | 2/2007 | Harney et al. |
| 2007/0042521 A1 | 2/2007 | Yama |
| 2008/0290430 A1 | 11/2008 | Mahadevan et al. |
| 2009/0085191 A1 | 4/2009 | Najafi et al. |
| 2010/0044880 A1* | 2/2010 | Aokura ............. H01L 23/49822 |
| | | 257/777 |
| 2011/0127623 A1 | 6/2011 | Fueldner et al. |
| 2011/0165717 A1 | 7/2011 | Lee et al. |
| 2011/0215453 A1 | 9/2011 | Eng et al. |
| 2012/0049298 A1 | 3/2012 | Schlarmann et al. |
| 2012/0068278 A1 | 3/2012 | Knipe et al. |
| 2012/0248552 A1 | 10/2012 | Benzel |
| 2012/0264250 A1 | 10/2012 | Graham et al. |
| 2013/0168840 A1 | 7/2013 | Merassi et al. |
| 2013/0199295 A1 | 8/2013 | Hoefer et al. |
| 2013/0270660 A1 | 10/2013 | Bryzek et al. |
| 2013/0285165 A1 | 10/2013 | Classen et al. |
| 2013/0292793 A1 | 11/2013 | Poucher et al. |
| 2014/0217521 A1 | 8/2014 | Johari-Galle et al. |
| 2014/0339656 A1 | 11/2014 | Schlarmann |
| 2014/0353772 A1 | 12/2014 | Stermer |
| 2015/0021075 A1* | 1/2015 | Okamoto ............... H05K 1/181 |
| | | 174/259 |
| 2015/0123256 A1 | 5/2015 | Kierse et al. |
| 2015/0197419 A1 | 7/2015 | Cheng et al. |
| 2016/0061677 A1* | 3/2016 | Han ..................... G01L 9/0045 |
| | | 438/51 |
| 2016/0090297 A1 | 3/2016 | Zhang et al. |
| 2016/0159641 A1 | 6/2016 | Najafi et al. |
| 2016/0229688 A1 | 8/2016 | Gu et al. |
| 2017/0073218 A1* | 3/2017 | Kaanta .................. B81B 7/0048 |
| 2017/0122976 A1 | 5/2017 | Mitchell et al. |
| 2018/0148318 A1 | 5/2018 | Flynn et al. |
| 2018/0148325 A1 | 5/2018 | Duqi et al. |
| 2018/0230005 A1 | 8/2018 | Lee et al. |
| 2019/0047846 A1 | 2/2019 | Zhang et al. |
| 2019/0241428 A1 | 8/2019 | Mitchell et al. |
| 2020/0002159 A1 | 1/2020 | Theuss et al. |
| 2020/0141966 A1 | 5/2020 | Samuelson et al. |
| 2020/0211944 A1* | 7/2020 | Lin ..................... H01L 23/3192 |
| 2020/0243483 A1* | 7/2020 | Kuo .................... H01L 23/5383 |
| 2020/0283291 A1 | 9/2020 | Krishna et al. |
| 2021/0265281 A1 | 8/2021 | Fitzgerald et al. |
| 2021/0380403 A1* | 12/2021 | Zhang .................. B81B 7/0048 |
| 2022/0301969 A1* | 9/2022 | Noh ...................... H01L 21/563 |
| 2022/0328426 A1 | 10/2022 | Fitzgerald et al. |
| 2023/0066598 A1* | 3/2023 | Lai ...................... H01L 23/3135 |
| 2023/0234835 A1 | 7/2023 | Zhang et al. |
| 2025/0118715 A1 | 4/2025 | Zhang et al. |

FOREIGN PATENT DOCUMENTS

| | | |
|---|---|---|
| DE | 10 2010 042 113 A1 | 4/2012 |
| EP | 0 788 157 A2 | 6/1997 |
| EP | 4469388 | 12/2024 |
| EP | 4470035 | 12/2024 |
| JP | 60-077434 A | 5/1985 |
| JP | 62-241335 A | 10/1987 |
| JP | 05-226501 A | 9/1993 |
| JP | 07-142518 A | 6/1995 |
| JP | 08-116007 A | 5/1996 |
| WO | WO 83/01362 A1 | 4/1983 |

| | | |
|---|---|---|
| WO | WO 91/05368 A1 | 4/1991 |
| WO | WO 2007/030345 A2 | 3/2007 |
| WO | WO 2012/037537 A2 | 3/2012 |
| WO | WO 2016/112463 A1 | 7/2016 |
| WO | WO 2018/041635 | 3/2018 |

OTHER PUBLICATIONS

[No Author Listed], Electret Condenser Microphone Cartridge Preamplifier, Maxim Integrated Products, Jul. 2002, 9 pages.

[No Author Listed], Liquid Crystal Polymer (LCP) Air Cavity Packages, Quantum Leap Packaging, Inc., Brochure, 2004, 2 pages.

[No Author Listed], Microphone industry to expand MEMS-based offerings, The Information Network, online <www.theinformationnet.com>, printed Feb. 1, 2005, Nov. 14, 2003, 2 pages.

[No Author Listed], Phone-Or/Technology, online, printed Feb. 1, 2005, 2 pages.

[No Author Listed], The Prismark Wireless Technology Report—Mar. 2005. Prismark Partners LLC; www.prismark.com, pp. 1-44.

Bajdechi et al., Single-Chip Low-Voltage Analog-to-Digital Interface for Encapsulation with Electret Microphone, The 11th International Conference on Solid-State Sensors and Actuators, Jun. 10-14, 2001, 4 pages.

Bernstein et al., High Sensitivity MEMS Ultrasound Arrays by Lateral Ferroelectric Polarization, Solid-State Sensor and Actuator Workshop, Jun. 4-8, 2000, 4 pages.

Bernstein, MEMS Air Acoustics Research The Charles Stark Draper Laboratory, PowerPoint Presentation, Aug. 1999, 8 pages.

Blackwell, The Electronic Packaging Handbook, CRC Press LLC, pp. 2-3, 7-1, 7-12, A-9, and A-11, 2000.

Brown, Advanced Electronic Packaging with Emphasis on Multichip Modules, Institute of Electrical and Electronics Engineers, Inc., pp. 4-8, 568, 1999.

Chen et al., Single-Chip Condenser Miniature Microphone with a High Sensitive Circular Corrugated Diaphragm, IEEE, 2002, 4 pages.

Cunningham et al., Wide bandwidth silicon nitride membrane microphones, SPIE vol. 3223, Sep. 1997, 9 pages.

Fan et al., Development of Artificial Lateral-Line Flow Sensors, Solid-State Sensor, Actuator and Microsystems Workshop, Jun. 2-6, 2002, 4 pages.

Fuldner et al., Silicon Microphones with Low Stress Membranes, The 11th International Conference on Solid-State Sensors and Actuators, Jun. 10-14, 2001, 4 pages.

Gale et al., MEMS Packaging, University of Utah, Microsystems Principles, PowerPoint Presentation, Oct. 11, 2001, 8 pages.

Hall et al., Self-Calibrating Micromachined Microphones with Integrated Optical Displacement Detection, The 11th International Conference on Solid State Sensors and Actuators, Jun. 10-14, 2001, 4 pages.

Harper (Editor-in-Chief), Electronic Packaging and Interconnection Handbook, Third Edition, McGraw-Hill, Chapter 7, Section 7.2.3.1, 2000, 7 pages.

Heuberger, Mikromechanik, Springer Verlang A.G., pp. 470-476, 1989.

Hsieh et al., A Micromachined Thin-film Teflon Electret Microphone, Department of Electrical Engineering California Institute of Technology, 1997, 4 pages.

Judy, Microelectromechanical systems (MEMS): fabrication, design and applications. Electrical Engineering Department, Institute of Physics Publishing, Smart Materials and Structures, vol. 10, pp. 1115-1134 Nov. 26, 2001.

Kabir et al., High Sensitivity Acoustic Transducers with Thin P+ Membranes and Gold Back-Plate, Sensors and Actuators, vol. 78, Issue 2-3, Dec. 17, 1999, 17 pages.

Kilchytska et al., Silicon-on-Nothing MOSFETs: An efficient solution for parasitic substrate coupling suppression in SOI devices. Applied Surface Science. Jul. 30, 2008; 254(19): 6168-6173.

Ko et al., Piezoelectric Membrane Acoustic Devices, IEEE, 2002, 4 pages.

(56)          References Cited

OTHER PUBLICATIONS

Kopola et al., MEMS Sensor Packaging Using LTCC Substrate Technology, VTT Electronics, Proceedings of SPIE vol. 4592, 2001, pp. 148-158.

Ma et al., Design and Fabrication of an Integrated Programmable Floating-Gate Microphone, IEEE, 2002, 4 pages.

Mason, Companies Compete To Be Heard On the Increasingly Noisy MEMS Phone Market, Small Times: News about MEMS, Nanotechnology and Microsystems, Jul. 18, 2003, 4 pages.

Neumann et al., A Fully-Integrated CMOS-MEMS Audio Microphone, The 12th International Conference on Solid State Sensors, Actuators and Microsystems Jun. 8-12, 2003, 4 pages.

Ono et al., Design and Experiments of Bio-mimicry Sound Source Localization Sensor with Gimbal-Supported Circular Diaphragm, The 12th International Conference on Solid State Sensors, Actuators and Microsystems, Jun. 8-12, 2003, 4 pages.

Pecht, Handbook of Electronic Package Design, Marcel Dekker, Inc. pp. 173, 179, 196, 210, 736, 744, 821 and 832, 1991.

Pedersen et al., A Polymer Condenser Microphone on Silicon with On-Chip CMOS Amplifier, Solid State Sensors and Actuators, 1997, 3 pages.

Rugg et al., Thermal Package Enhancement Improves Hard Disk Drive Data Transfer Performance, Pan Pacific Microelectronics Symposium, Proceedings of the Technical Program, Island of Maui, Hawaii, Feb. 5-7, 2002, pp. 451-456.

Schafer et al., Micromachined Condenser Microphone for Hearing Aid Use, Solid-State Sensor and Actuator Workshop, Jun. 8-11, 1998, 4 pages.

Sheplak et al., A Wafer-Bonded, Silicon-Nitride Membrane Microphone with Dielectrically-Isolated, Single-Crystal Silicon Piezoresistors, Solid-State Sensor and Actuator Workshop, Jun. 8-11, 1998, 4 pages.

Stahl et al., Thin Film Encapsulation of Acceleration Sensors Using Polysilicon Sacrificial Layer, Transducers '03, The 12th International Conference on Solid State Sensors, Actuators and Microsystems, Jun. 8-12, 2003, 4 pages.

Tilmans et al., The indent reflow sealing (IRS) technique—a method for the fabrication of sealed cavities for MEMS devices. IEEE Journal of Microelectro-mechanical Systems. 2000; 9(2):206-217.

Tummula et al., Microelectronics Packaging Handbook, Semiconductor Packaging Part II, Second Edition, Chapman & Hall, pp. 11-12, 1997.

Weigold et al., A MEMS Condenser Microphone for Consumer Applications, Analog Devices, Inc. and Pixtronix, Inc., Jan. 2006, 4 pages.

Yovcheva et al., Investigation on Surface Potential Decay in PP Corona Electrets, BPU-5: Fifth General Conference of the Balkan Physical Union, Aug. 25-29, 2003, 4 pages.

Zou et al., A Novel Integrated Silicon Capacitive Microphone—Floating Electrode "Electret" Microphone (FEEM), Journal of Microelectromechanical Systems, vol. 7, No. 2, Jun. 1998, 11 pages.

International Search Report and Written Opinion mailed Apr. 14, 2023 in connection with International Application No. PCT/US2023/011426.

International Preliminary Report on Patentability mailed Aug. 8, 2024 in connection with International Application No. PCT/US2023/011426.

International Search Report and Written Opinion mailed May 25, 2023 in connection with International Application No. PCT/US2023/011465.

International Preliminary Report on Patentability mailed Aug. 8, 2024 in connection with International Application No. PCT/US2023/011465.

Extended European Search Report mailed Jan. 7, 2026 in connection with European Patent Application No. 23747527.2.

Extended European Search Report mailed Jan. 7, 2026 in connection with European Patent Application No. 23747515.7.

* cited by examiner

STRESS ISOLATION FOR INTEGRATED CIRCUIT PACKAGE INTEGRATION

CROSS-REFERENCE TO RELATED APPLICATION

This application claims the benefit under 35 U.S.C. § 119(e) of U.S. Application Ser. No. 63/303,013, filed Jan. 25, 2022, and entitled "HETEROGENEOUS INTEGRATION OF MEMS SENSORS AND MULTIPLE CIRCUIT CHIPS," which is hereby incorporated herein by reference in its entirety.

FIELD OF THE DISCLOSURE

The present application relates to stress isolation for heterogenous integrated circuit (IC) package integration, including wafer level chip scale packaging (WLCSP).

BACKGROUND

Wafer level chip scale packaging is used to package integrated circuits (ICs), microelectromechanical systems (MEMS), or both.

SUMMARY OF THE DISCLOSURE

Heterogeneous integrated circuit (IC) packaging structures and techniques are provided exhibiting stress isolation. In some embodiments, wafer level chip scale packages with stress isolation are provided, in addition to signal routing features such as through-silicon vias (TSV), redistribution layers (RDL) and solder bump features. The packaging structure includes an interposer having stress isolation features. The stress isolation features are stress isolation platforms in some instances. The stress isolation platforms are configured to isolate stress from a substrate with which the interposer is coupled, preventing the stress from propagating from the substrate to a packaged die. The packaged die may be an integrated circuit (IC) die, a microelectromechanical systems (MEMS) die, a sensor die (e.g., an optical die, a magnetic sensor die, a biosensor die, a microfluidics die) or a combination, among other possible device types. In some embodiments, multiple dies are packaged.

Packaging structures other than wafer WLCSP are also disclosed, such as general 2D and 3D heterogeneous IC package integrations such as multi-die flip-chip, fan-in and fan-out package, wafer level package, silicon, silicon carbide, silicon germanium, gallium arsenide, gallium nitride, glass, ceramic, laminate, or other type of IC dies and IC packages.

Packaging of microfabricated devices is described, such as IC, MEMS and sensor devices. The packaging is wafer level chip scale packaging in at least some embodiments. The wafer level chip scale packaging includes an interposer. The interposer includes stress relief features. Thus, stresses originating in the packaging do not propagate to the packaged device.

Some embodiments relate to a 3D heterogeneous packaged device, comprising: a device die; and an interposer coupled with the device die at a plurality of bond points, the interposer comprising a plurality of stress isolation platforms at different locations from the plurality of bond points.

In some embodiments, a first stress isolation platform of the plurality of stress isolation platforms is coupled to a remainder of the interposer by a plurality of stress isolation suspensions.

In some embodiments, the plurality of bond points are a first plurality of bond points, and wherein the 3D heterogeneous packaged device further comprises a substrate coupled with the interposer at a second plurality of bond points aligned with the plurality of stress isolation platforms, wherein the interposer is disposed between the device die and the substrate.

In some embodiments, the device die is an integrated circuit die and the substrate is a printed circuit board, silicon substrate, silicon carbide substrate, silicon germanium substrate, gallium arsenide substrate, gallium nitride substrate, glass substrate, ceramic substrate, or laminate substrate.

In some embodiments, the device die is an integrated circuit (IC) die, a microelectromechanical systems (MEMS) die, a sensor die, an optical die, a magnetic sensor die, a biosensor die, a microfluidics die), or a combination thereof.

In some embodiments, the device die is a first device die, and wherein the 3D heterogeneous packaged device further comprises a second device die coupled with the first device die in a vertical stack, with the interposer representing a bottom layer of the vertical stack, the first device die positioned above the interposer as a second layer of the vertical stack, and the second device die positioned above the first device die as a third layer of the vertical stack.

In some embodiments, the interposer comprises an outer portion and an inner portion, and wherein the stress isolation platforms are formed only at the outer portion of the interposer.

Some embodiments relate to a 3D heterogeneous packaged device, comprising: a substrate; an interposer, bonded to the substrate, comprising: a plurality of stress isolation platforms, at least one of the plurality of stress isolation platforms defining a portion of the interposer that is flexibly coupled to a remainder of the interposer by a plurality of stress isolation suspensions; and a bond pad formed in the at least one of the plurality of stress isolation platforms; a bond, in contact with the bond pad, coupling the interposer to the substrate; and a device die coupled to the interposer, wherein the interposer is disposed between the device die and the substrate.

In some embodiments, at least eight stress isolation suspensions flexibly couple the at least one of the plurality of stress isolation platforms to the remainder of the interposer.

In some embodiments, at least one of the plurality of stress isolation suspensions is formed between a pair of trenches that extend across an entire thickness of the interposer.

In some embodiments, the interposer comprises an outer portion and an inner portion, and wherein the stress isolation platforms are formed only at the outer portion of the interposer.

In some embodiments, the device die comprises a MEMS device and the interposer defines a cavity aligned with the MEMS device.

In some embodiments, the interposer further comprises a thru silicon via (TSV) electrically coupling the bond pad to the device die.

In some embodiments, the device die is a first device die, and wherein the 3D heterogeneous packaged device further comprises a second device die bonded to the first device die so that the first device die is between the interposer and the second device die.

In some embodiments, the substrate comprises a laminate substrate bonded to a printed circuit board.

Some embodiments relate to a method for fabricating a 3D heterogeneous packaged device, comprising: bonding an interposer to a device die; patterning the interposer with a plurality of bond pads; forming a plurality of stress isolation platforms by etching a plurality of trenches through the interposer so that at least one of the plurality of stress isolation platforms includes a bond pad of the plurality of bond pads; and with the interposer bonded to the device die, bonding the interposer to a substrate so that the interposer is between the device die and the substrate.

In some embodiments, the method further comprises filling the plurality of trenches with gel.

In some embodiments, the method further comprises forming a plurality of thru silicon vias (TSVs) through the interposer, wherein bonding the interposer to the device die comprises electrically coupling the device die to the TSVs.

In some embodiments, the device die comprises a MEMS device, wherein the method further comprises etching a cavity through the interposer, wherein bonding the interposer to the device die comprises aligning the MEMS device to the cavity.

BRIEF DESCRIPTION OF THE DRAWINGS

The accompanying drawings are not intended to be drawn to scale. In the drawings, each identical or nearly identical component that is illustrated in various figures may be represented by a reference numeral or character. For purposes of clarity, not every component may be labeled in every drawing. In the drawings.

DETAILED DESCRIPTION

I. Overview

Stress-isolation structures are described for 2D and 3D heterogeneous packaged device integration. Examples of such heterogeneous packaging include wafer level chip scale packaging (WLCSP), multi-die flip-chip, fan-in and fan-out packaging, wafer level package packaging, silicon, silicon carbide, silicon germanium, gallium arsenide, gallium nitride, glass, ceramic, laminate, or other type of IC dies and IC packages. Such packaging is sometimes used to package integrated circuits (ICs), microelectromechanical systems (MEMS) devices, or other devices. Some such devices include stress isolation structures at the die level, for instance built into the IC die or MEMS die. Such dies may be relatively large, and electrical connections to the die may be made via wire bonding. Smaller dies may be utilized in 3D heterogeneous packaged devices that employ bump bonding, solder balls, or other similar bonding structures. Electrical connection may be made to the packaged IC or MEMS device via such bonding connections, without the need for wire bonding. However, because bump bonds, solder bumps, and other similar bonding structures may be substantially rigid, stresses originating from the packaging may propagate into the packaged IC or MEMS device. The inventors have appreciated that including stress isolation features in an interposer of the 2D or 3D heterogenous packaged device may reduce or eliminate the propagation of stresses from the packaging to the IC or MEMS device. Thus, the packaged IC or MEMS device may effectively be isolated from external stresses. As a result, sensitive electronics and/or mechanical components of the packaged IC and/or MEMS device may be protected, and the negative effects of undesired stresses on the device operation may be mitigated.

Although ICs and MEMS devices are described above, it should be appreciated that aspects of the present application apply as well to other types of microfabricated devices, such as optical dies, sensor dies, and other microfabricated devices.

II. Examples of Interposers with Stress Isolation Platforms

Figure 1A:
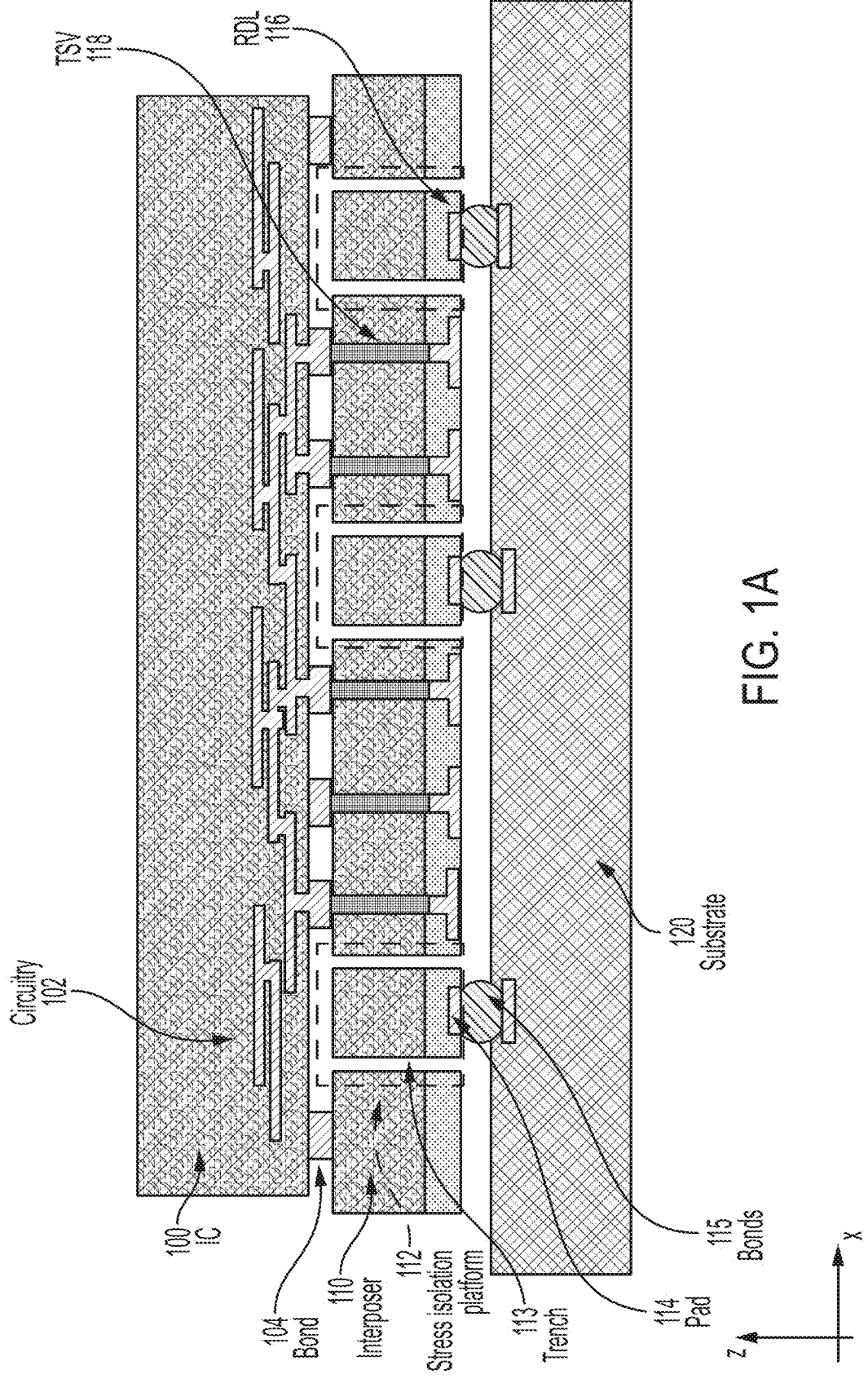
FIG. 1A illustrates a cross-sectional view of a 3D heterogenous packaged integrated circuit (IC) having an interposer with stress isolation and signal routing, according to a non-limiting embodiment of the present application.

According to an aspect of the present application, a 3D heterogeneous packaged device includes a packaged IC and an interposer with stress isolation, as well as signal routing features. FIG. 1A illustrates a non-limiting example, and shows a cross-sectional view of a 3D heterogeneous packaged integrated circuit (IC) having an interposer with stress isolation. The illustrated 3D heterogeneous packaged device includes an IC (die) 100, an interposer 110, and a substrate 120. It should be appreciated that the illustrated interposer may be a portion of a larger interposer, focused on a few stress isolation platforms. In practice, the interposer may, and in some embodiments is, larger and will include multiple such stress-isolated platforms.

Substrate 120 may be any suitable type of substrate, including silicon, silicon carbide, silicon germanium, gallium arsenide, gallium nitride, glass, ceramic, a laminate substrate, a PCB, or a flexible substrate, among others.

IC 100 may be any suitable type of IC. In at least some embodiments, IC 100 may include sensitive electronics, such as circuitry 102, the operation of which may be negatively impacted by stress. In this respect, the IC may be a stress-sensitive IC. Non-limiting examples of circuitry 102 include digital circuits, analog circuits, sensors, MEMS devices, optical devices, among others.

IC 100 is bonded to interposer 110 via bonds 104. Bonds 104 may be micro bump bonds, metal-metal bonding (e.g., eutectic bonding) or any other suitable type of bonding. Multiple bond points may be provided between IC 100 and the interposer 110.

Interposer 110 includes stress isolation platforms 112. Stress isolation platforms 112 isolate the packaged IC from substrate 120, such that stresses experienced by substrate 120 (whether originated in the substrate itself or in other parts of the package) do not propagate to IC 100 and negatively impact its operation. Stress isolation platforms 112 serve as coupling points for coupling interposer 110 to substrate 120. Bonding is achieved via bonds 115, which may include solder balls, solder pads, or by flip chip bonds. Pads 114 are formed on the surface of interposer 110 and provide electrical connection to bonds 115. Any suitable number of stress isolation platforms 112 may be provided in the interposer 110. The number of stress isolation platforms may be approximately the same as, or may match, the number of bond points between the interposer and the substrate. However, not all embodiments are limited in this respect.

In some embodiments, interposer 110 may further support signal routing between IC 100 and substrate 120. In the example of FIG. 1A, thru silicon vias (TSVs) 118 are formed through interposer 110 and support signal routing from circuitry 102 to substrate 120, and vice versa. A redistribution layer (RDL) 116 couples TSVs 118 to bonds 115. In some embodiments, interposer 110 may be a passive substrate in that it lacks active (e.g., energy consuming) electronic devices or circuits. For example, interposer 110 may lack transistors.

In some embodiments, the package illustrated in FIG. 1A (and any one of the packages illustrated on the following figures) may be fabricated in accordance with wafer level chip scale packaging (WLCSP) techniques. Accordingly, IC 100 may be bonded to interposer 110 before the wafer on which ASIC 100 is formed is diced. In other words, IC 100 may be bonded to interposer 110 when it is still part of the wafer. Dicing can occur after IC 100 and interposer 110 are bonded to one another. With WLCSP, the resulting package is practically of the same lateral extension as ASIC 100, thereby avoiding unnecessary waste of space.

Figure 1B:
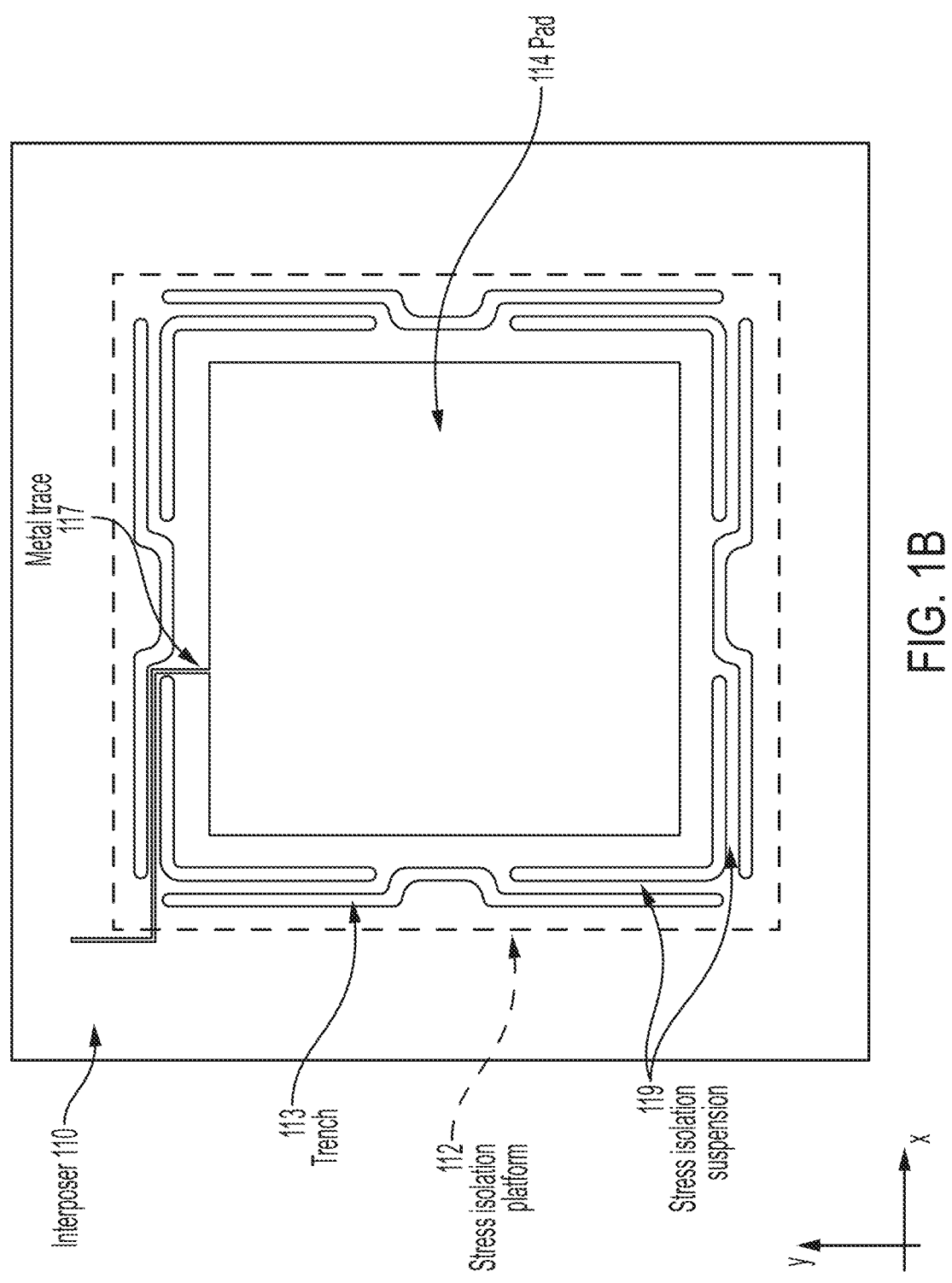
FIG. 1B illustrates a top view of one of the stress isolation platforms formed in the interposer of the 3D heterogeneous packaged IC of FIG. 1A, according to a non-limiting embodiment of the present application.

FIG. 1B illustrates a top view of a stress isolation platform 112 of the 3D heterogeneous packaged device of FIG. 1A. Stress isolation platform 112 may be a dual-purpose platform providing both mechanical stress isolation and electrical connectivity between substrate 120 and IC 100. As shown, stress isolation platform 112 may include a plurality of stress isolation suspensions 119 defined at least in part by a plurality of stress isolation trenches 113 that are etched through the interposer. The stress isolation suspensions 119 flexibly couple the stress isolation platforms 112 to the remaining part of the interposer 110. Thus, the stress isolation platforms 112 and the remaining part of the interposer 110 are free to move relative to each other, being mechanically independent of each other. Trenches 113 may be formed in any suitable number and shape. The stress isolation platform of FIG. 1B includes eight trenches, four of which are L-shaped. A first segment of an L-shaped trench runs parallel to a first side of pad 114 and a second segment of the L-shaped trench runs parallel to a second side of pad 114 that is perpendicular to the first side. Each of the remaining four trenches runs parallel to a respective side of pad 114. Each suspension 119 is formed between a pair of trenches 113, as shown in FIG. 1B.

To permit free movement of a stress isolation platform 112 relative to the remainder of the interposer, trenches 113 may extend across the entire thickness of interposer 110 (along the z-axis), from the top surface to the bottom surface, as shown in FIG. 1A. A trench may be formed from a single vertical segment extending across the entire thickness of the interposer, or alternatively, may be formed of multiple offset vertical segments coupled together by horizontal or angled segments, in a zig-zag configuration. In some embodiments, trenches 113 may be filled with a gel or other low stress materials to improve mechanical strength while still permitting free movement of the stress isolation platforms.

The stress isolation platforms 112 also provide electrical interconnectivity between substrate 120 and IC 110. As shown in FIG. 1B, a metal pad 114 may be provided on a stress isolation platform 112, and one or more metal traces 117 may be routed from the stress isolation platform 112 over to electrical connection points on the device, whether an IC, MEMS device, sensor die, or other type of device. For example, the metal traces 117 are deposited on top of the suspensions 19 over to the electrical connection points in some embodiments, as shown. Thus, interposer 110 provides both stress isolation and signal routing functionality. In some embodiments, a stress isolation platform 112 may include more than one pad 114, thereby providing multiple points of contact with substrate 120 within the stress isolation platform.

It should be appreciated that the example stress suspensions illustrated in FIG. 1B are non-limiting. In that example, eight stress isolation suspensions 119 are provided, positioned symmetrically about the stress isolated platform 112. That is, two stress isolation suspensions 119 are positioned on each side of the stress isolation platform 112. However, other configurations are possible. For example, a stress isolation platform may include more than eight stress isolation suspensions.

Figure 1C:
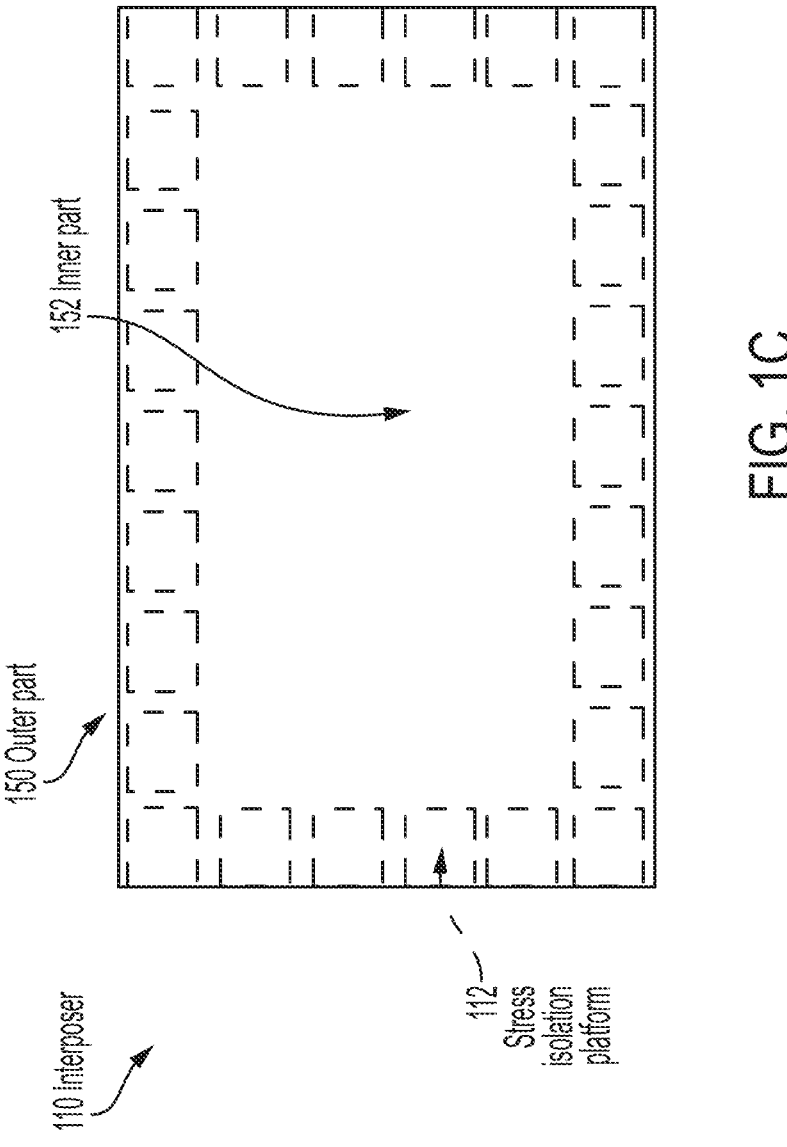
FIG. 1C illustrates a top view of an interposer having an outer portion and an inner portion, where the outer portion includes a plurality of stress isolation platforms, in accordance to a non-limiting embodiment of the present application.

In some cases, the stress isolation platforms can be formed only at an outer part of the die (without stress isolation platforms at the inner part of the die). Such a configuration, illustrated in FIG. 1C, may be particularly beneficial with larger dies. In the example of FIG. 1C, the inner part 152 of interposer 110 may include rigid (and optionally fine pitch) connections to substrate 120. Multiple stress isolation platforms 112 are formed on the outer part 150 of the interposer. This approach relieves the stress of the outer connection points and provides improved solder joint reliability at those points. In such a configuration, stress may not be relieved for the entire interposer. The stress isolation platforms 112 may completely surround the stress isolation platform-free part of the interposer, as shown in FIG. 1C, although not all embodiments are limited to this configuration.

Figure 1D:
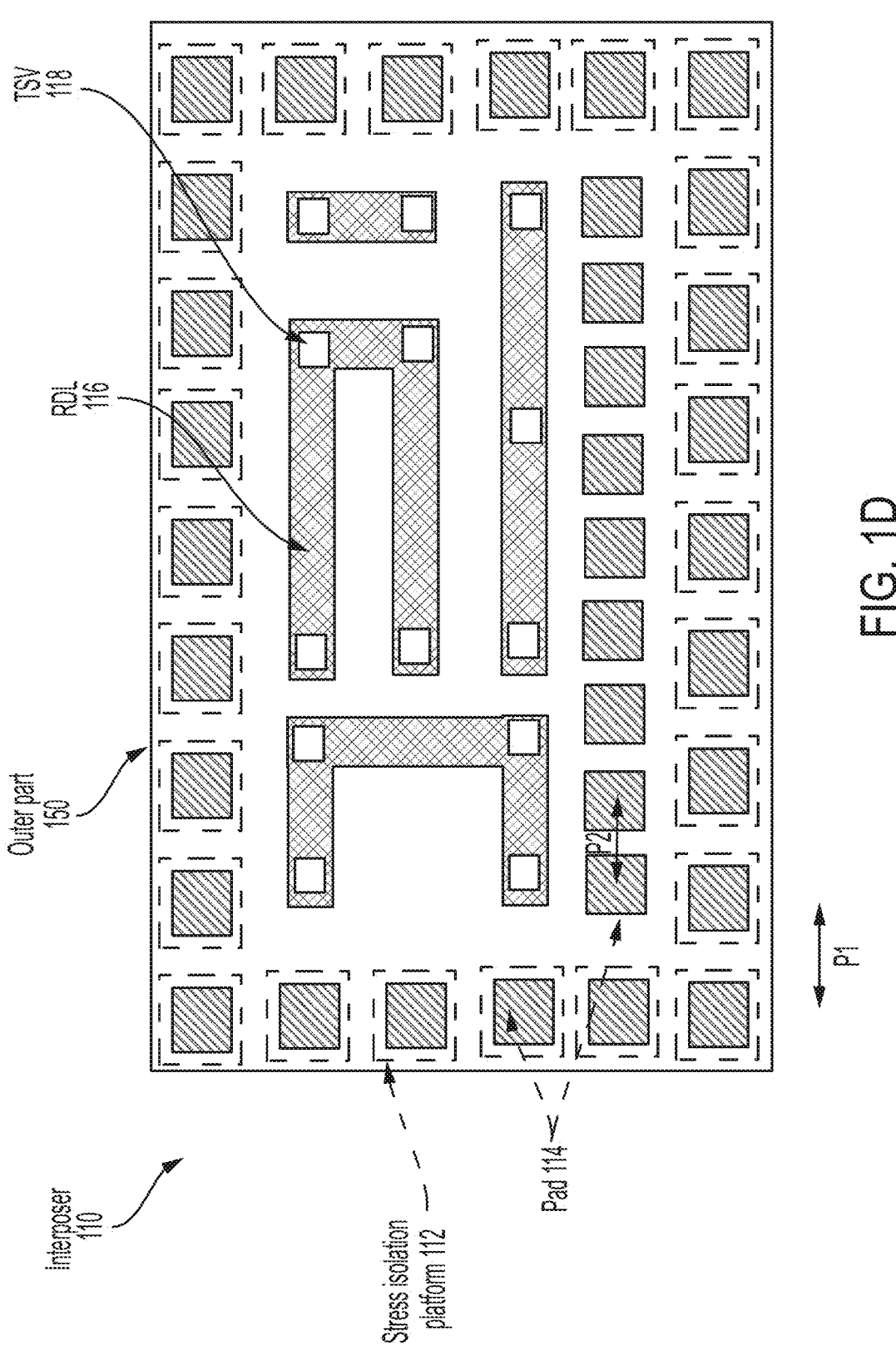
FIG. 1D illustrates another top view of the interposer of FIG. 1C showing additional details, in accordance to a non-limiting embodiment of the present application.

FIG. 1D illustrates another top view of the interposer of FIG. 1C showing additional details, in accordance to a non-limiting embodiment of the present application. As in the example of FIG. 1C, stress isolation platforms 112 are shown as being formed only at an outer part of the die (without stress isolation platforms at the inner part of the die). FIG. 1D further illustrates that each stress isolation platform 112 encompasses a pad 114 (although some stress isolation platforms may encompass more than one pad). The inner part of interposer 110 includes additional pads 114, also configured for connection with the underlying substrate. Those inner pads are not associated with stress isolation platforms. In some embodiments, the pitch of the outer pads (P1) is greater than the pitch of the inner pads (P2). FIG. 1D further illustrates traces formed as part of RDL 116, and TSVs 118 that connect to various points of RDL 116.

Figure 2:
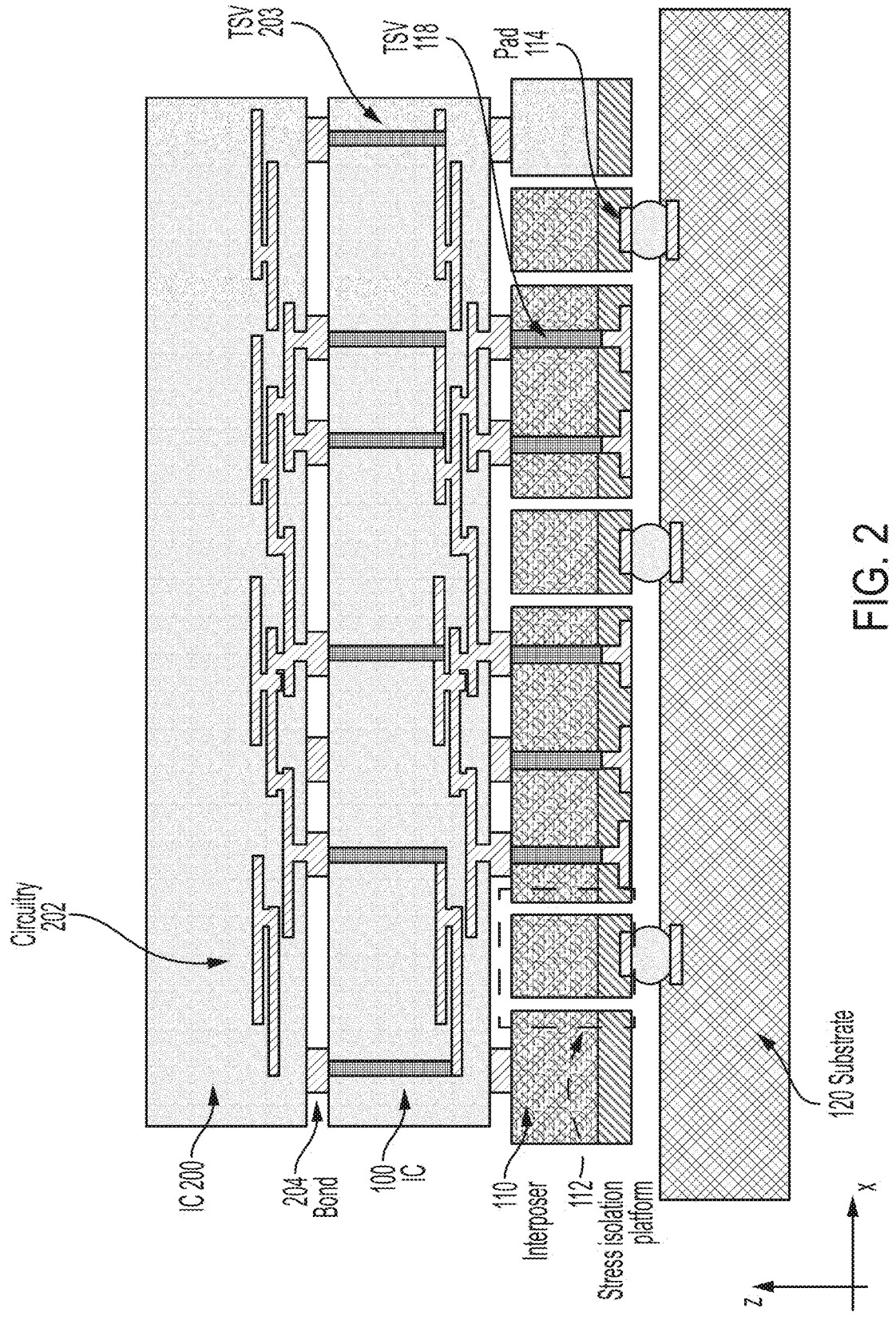
FIG. 2 illustrates a cross-sectional view of a 3D heterogenous packaged device comprising two integrated circuits (ICs) and an interposer with stress isolation and signal routing, according to a non-limiting embodiment of the present application.

In some embodiments, multiple ICs may be packaged as part of the 3D heterogeneous package. FIG. 2 illustrates a non-limiting example, showing a cross-sectional view of a 3D heterogeneous packaged device comprising two integrated circuits (ICs) and an interposer 110 with stress isolation. The 3D heterogeneous device differs from that of FIG. 1A in that a second IC 200 is added above the first IC 100. ASIC 200 includes circuitry 202. The first IC 100 is disposed between the interposer 110 and the second IC 200. Thru-silicon vias 203 provide electrical connection between the two ICs. Bonds 204 provide mechanical connection between the two ICs.

Figure 3:
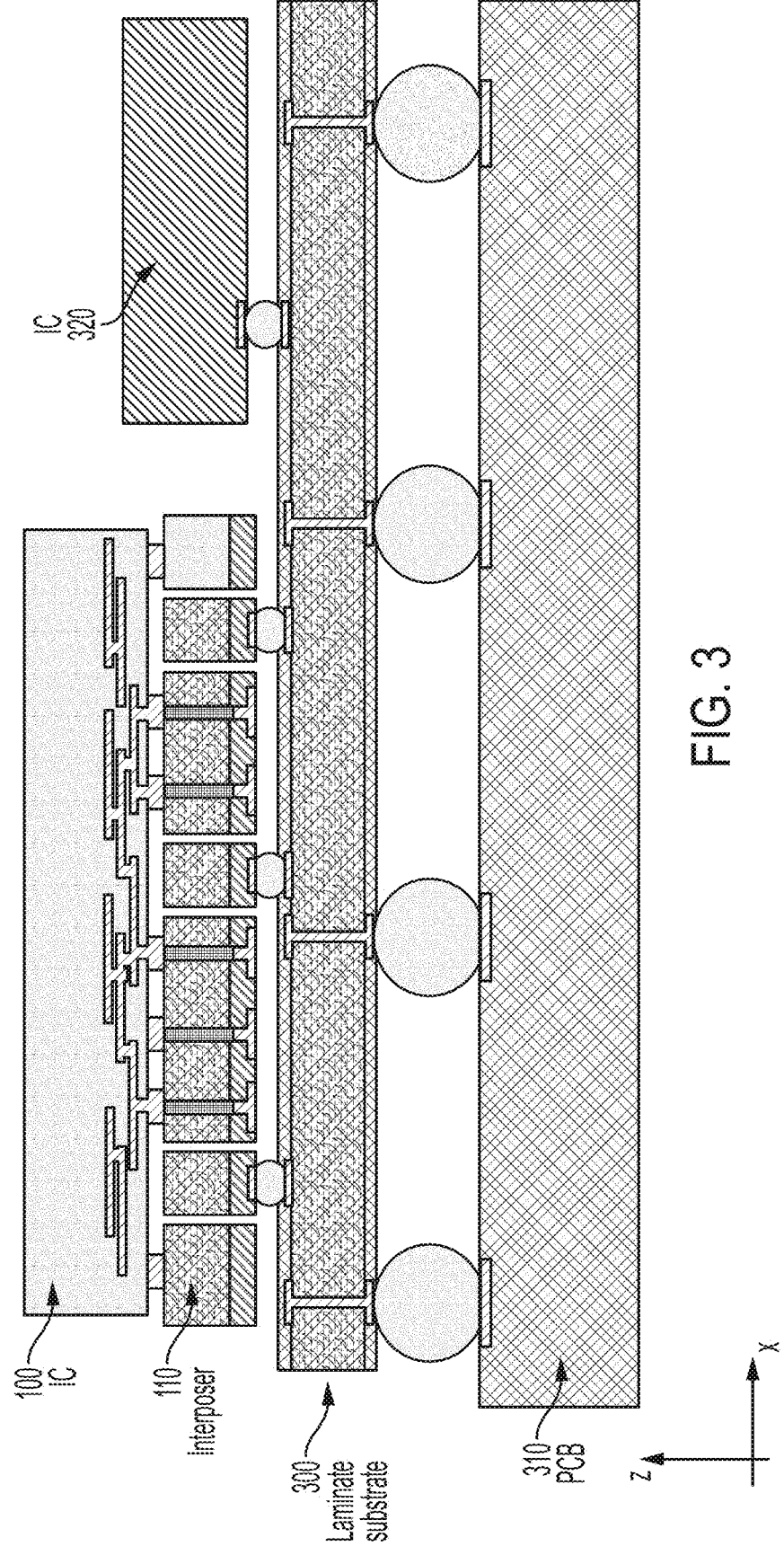
FIG. 3 illustrates a cross-sectional view of a 3D heterogenous packaged IC having an interposer with stress isolation and signal routing, and bonded with a printed circuit board (PCB), according to a non-limiting embodiment of the present application.

According to an aspect of the present application, multiple packaged devices may be bonded to a common laminate substrate, and the laminate substrate may be bonded to a printed circuit board. FIG. 3 illustrates a non-limiting example, showing a cross-sectional view of a 3D heterogeneous packaged IC having an interposer with stress isolation, and bonded with a printed circuit board (PCB) 310. As shown, interposer 110 is bonded to laminate 300, which in turn is bonded to PCB 310 with solder ball bonding, although alternatives are possible. In addition, as shown, additional (e.g., a second) packaged devices (e.g., an IC 320) may be arranged in a 2D manner with the explicitly illustrated device on laminate substrate 300. The packaged devices may be disposed laterally to the side of the first IC 100, thus providing a laterally packaged, stress-isolated multi-chip package. In some embodiments, the additional microfabricated devices (e.g., a second IC 320) may not be packaged, and stress isolation may not be provided for it.

Figure 4:
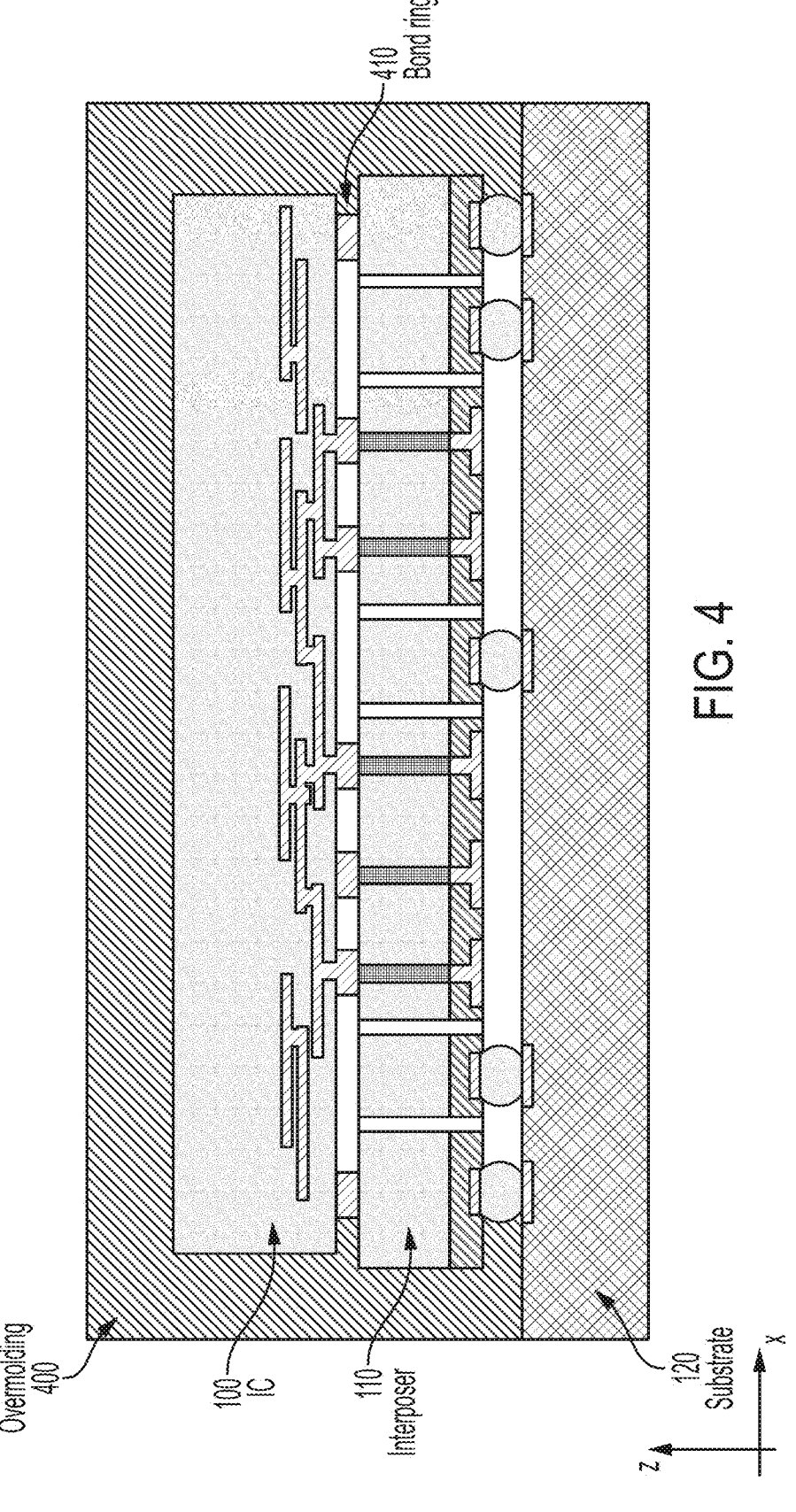
FIG. 4 illustrates a cross-sectional view of an overmolded 3D heterogeneous packaged IC having an interposer with stress relief and signal routing, according to a non-limiting embodiment of the present application.

FIG. 4 illustrates a cross-sectional view of an overmolded 3D heterogeneous packaged IC having an interposer with stress isolation, according to a non-limiting embodiment of the present application. The overmolding 400 encapsulates the IC 100 and interposer 110. A bond ring 410 is provided on the interposer 110 to prevent the molding compound from contaminating the sensitive parts of the device.

Figure 5:
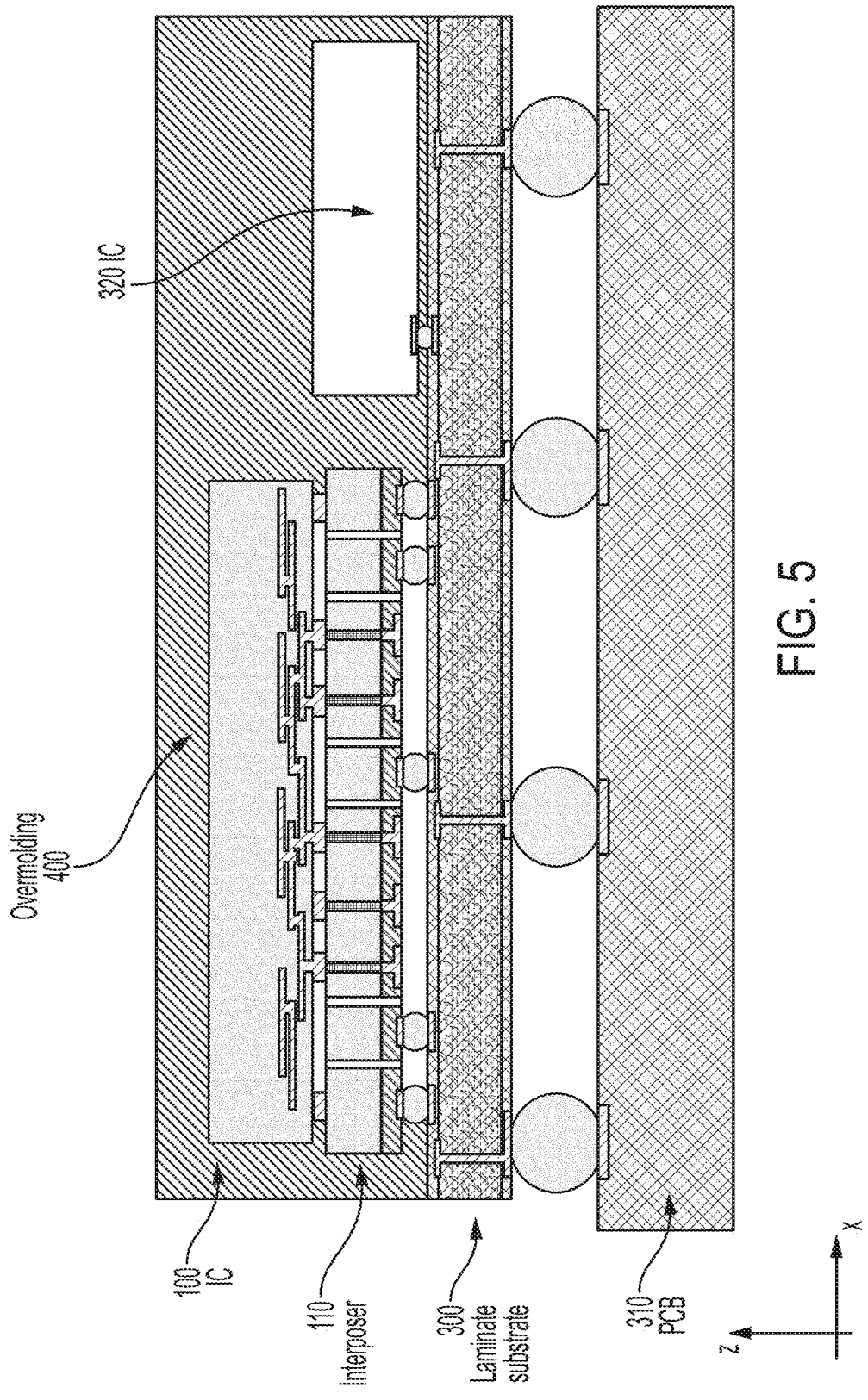
FIG. 5 illustrates a cross-sectional view of an overmolded version of the apparatus of FIG. 3 also exhibiting 2D integration of multiple packaged devices, according to a non-limiting embodiment of the present application.

FIG. 5 illustrates a cross-sectional view of an overmolded version of the apparatus of FIG. 3, according to a non-limiting embodiment of the present application, with the addition of additional laterally positioned packaged devices 320. That is, as shown, other IC chips or microfabricated devices may be positioned laterally with respect to the explicitly-illustrated IC, with all such devices being overmolded.

Figure 6:
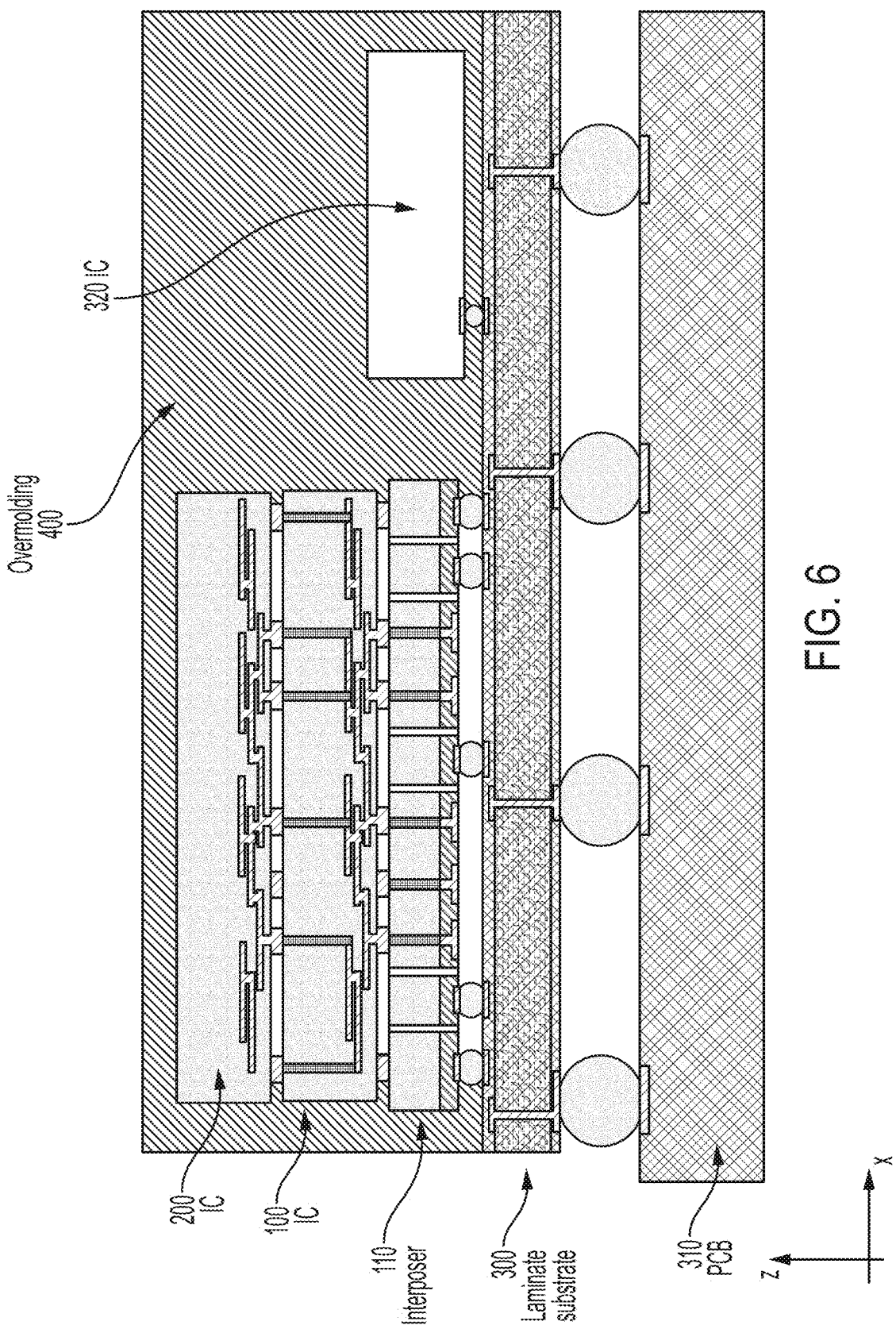
FIG. 6 illustrates a cross-sectional view of an overmolded 3D heterogenous packaged device comprising two ICs and an interposer with stress isolation and signal routing, according to a non-limiting embodiment of the present application.

FIG. 6 illustrates a cross-sectional view of an overmolded 3D heterogeneous packaged device comprising two ICs and an interposer with stress isolation, together with additional packaged microfabricated devices (e.g., ICs 320) laterally positioned on the same laminate substrate 300, according to a non-limiting embodiment of the present application. Thus, it should be appreciated from this non-limiting example that both 2D and 3D stress-isolated packaging may be provided for multiple devices with a laminate or other suitable substrate.

III. Stress Isolation in MEMS Devices

Figure 7A:
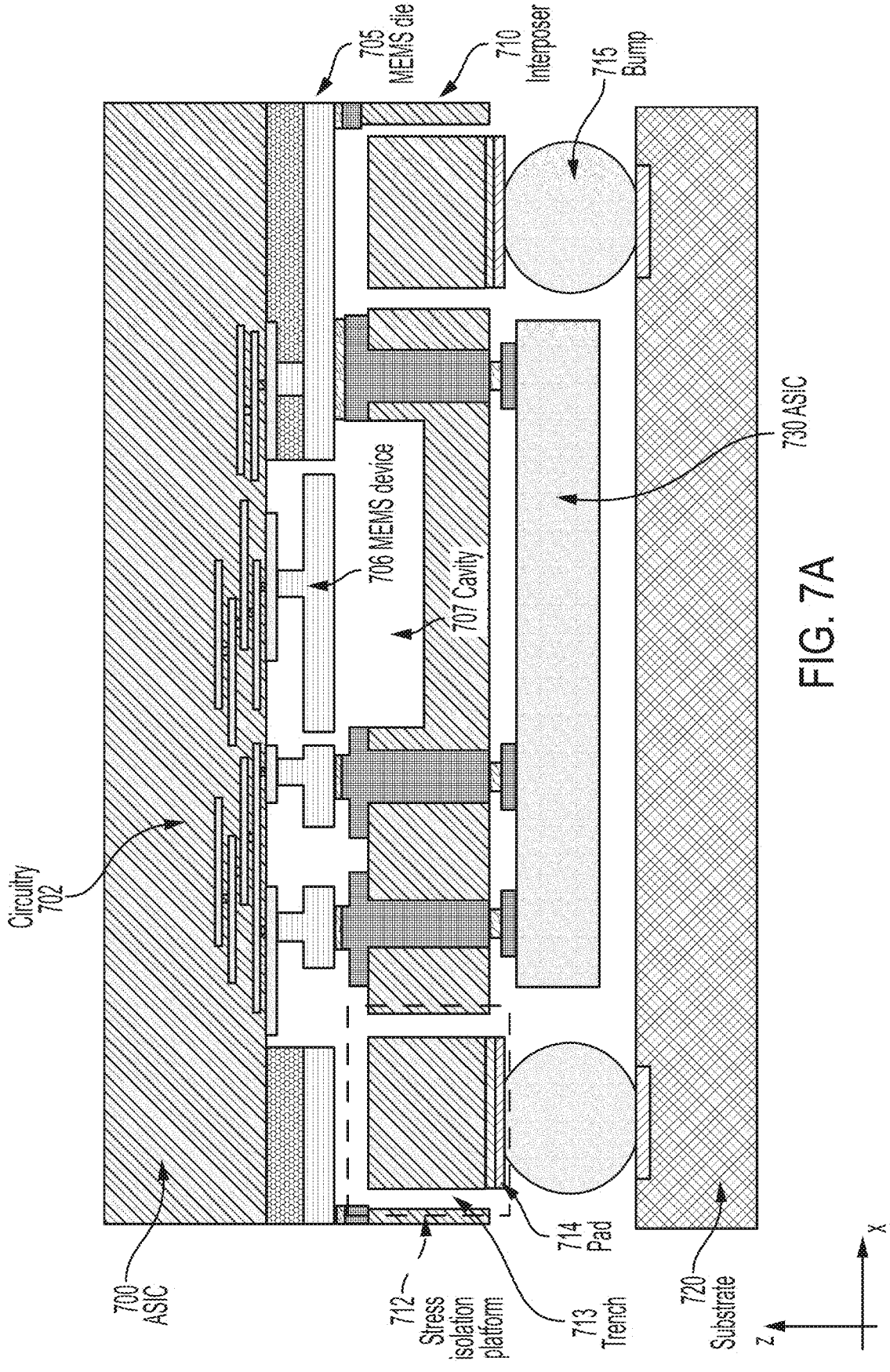
FIG. 7A illustrates a cross-sectional view of a 3D heterogeneous packaged integrated circuit (IC) and MEMS device having an interposer with stress isolation and signal routing, according to a non-limiting embodiment of the present application.

According to an aspect of the present application, the stress isolation techniques described herein may be used in connection with microelectromechanical systems (MEMS) devices. For example, stress isolation may be built into an interposer with a cavity, where the interposer acts as a cap for a MEMS device. FIG. 7A illustrates an example, showing a cross-sectional view of a 3D heterogeneous packaged device having an ASIC 700, a MEMS die 705, an interposer 710 with stress isolation and signal routing, and a substrate 720. The device of FIG. 7A may further include an optional additional ASIC 730. MEMS die 705 includes a MEMS device 706. MEMS device 706 may include a MEMS accelerometer, a MEMS gyroscope, a MEMS resonator, a MEMS switch, a MEMS optical device, or any other device having a movable mass. A cavity 707 is formed through interposer 710 in correspondence with MEMS device 706. Cavity 707 provides sufficient space to allow for motion of MEMS device 706 towards interposer 710. In this respect, interposer 710 may be viewed as a cap substrate for the MEMS device. ASIC 702 includes circuitry 702, configured to electrically interface with MEMS device 706. Circuitry 702 may include, for example, circuitry for driving motion of MEMS device 706 (in the case of active MEMS devices, such as resonators and gyroscopes) and/or circuitry for sensing motion of the MEMS device, among other types of circuitry.

In the device of FIG. 7A, interposer 710 and MEMS die 705 are disposed between ASIC 700 and ASIC 730. Accordingly, ASIC 700, MEMS die 705, interposer 710 and ASIC 730 form a vertical stack. Interposer 710 further includes TSVs placing ASIC 700 in communication with ASIC 730. In some embodiments, ASIC 730 may include circuitry (not shown in FIG. 7A) for digital processing information obtained using circuitry 702. In FIG. 7A, the inner TSVs and the metal bond serve as hermetic seal for the MEMS device positioned inside cavity 707.

Figure 7B:
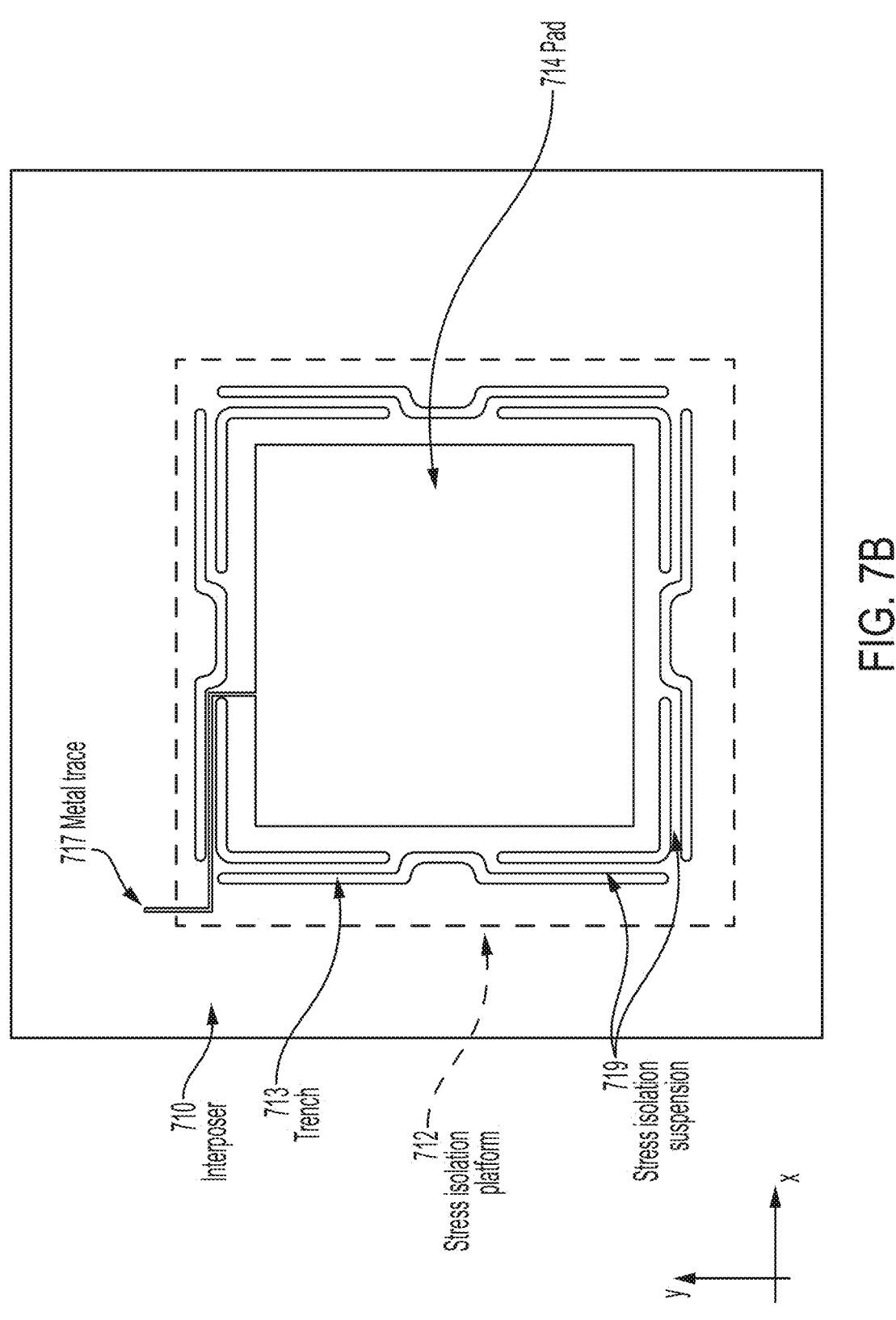
FIG. 7B illustrates a top view of the interposer of the 3D heterogeneous packaged IC and MEMS device of FIG. 7A, according to a non-limiting embodiment of the present application.

Interposer 710 further includes stress isolation platforms 712, which, similar to the stress isolation platforms described in connection with FIGS. 1A-1B, mechanically isolate MEMS die 705 from stress propagating from substrate 720. FIG. 7B illustrates a top view of a stress isolation platform 712 of the 3D heterogeneous packaged device of FIG. 7A. Stress isolation platform 712 may be a dual-purpose platform providing both mechanical stress isolation and electrical connectivity between substrate 720 and ASIC 700. Similar to the stress isolation platform 112, stress isolation platform 712 may include a plurality of stress isolation suspensions 719 defined at least in part by a plurality of stress isolation trenches 713 (also shown in FIG. 7A) that are etched through the interposer. The remaining stress isolation suspensions 719 flexibly couple the stress isolation platforms 712 to the remaining part of the interposer 710. Thus, the stress isolation platforms 712 and the remaining part of the interposer 710 are free to move relative to each other, being mechanically independent of each other. The stress isolation platforms 712 also provide electrical interconnectivity between substrate 720 and ASIC 700. A metal pad 714 may be provided on a stress isolation platform 712, and one or more metal traces 717 may be routed from the stress isolation platform 712 over to electrical connection points on the device.

It should be noted that stress isolation may be applied to MEMS devices in arrangements different from what is shown in FIG. 7A. In some embodiments, for example, either ASIC 700 or ASIC 730 (or both) may be omitted. In some embodiments, the package may include one or more ASICs in communication with MEMS die 705, but the ASIC(s) may be arranged in a 2D manner (as opposed to a 3D manner), similar to the arrangement shown in FIG. 3 (see IC 320).

Aspects of the present application provide stress isolated 3D heterogeneous packaged devices. The 3D heterogeneous packaged devices may be small, with electrical connections that are made by solder bumps, a ball grid array, or other techniques, excluding wire bonding.

IV. Fabrication

Figure 8:
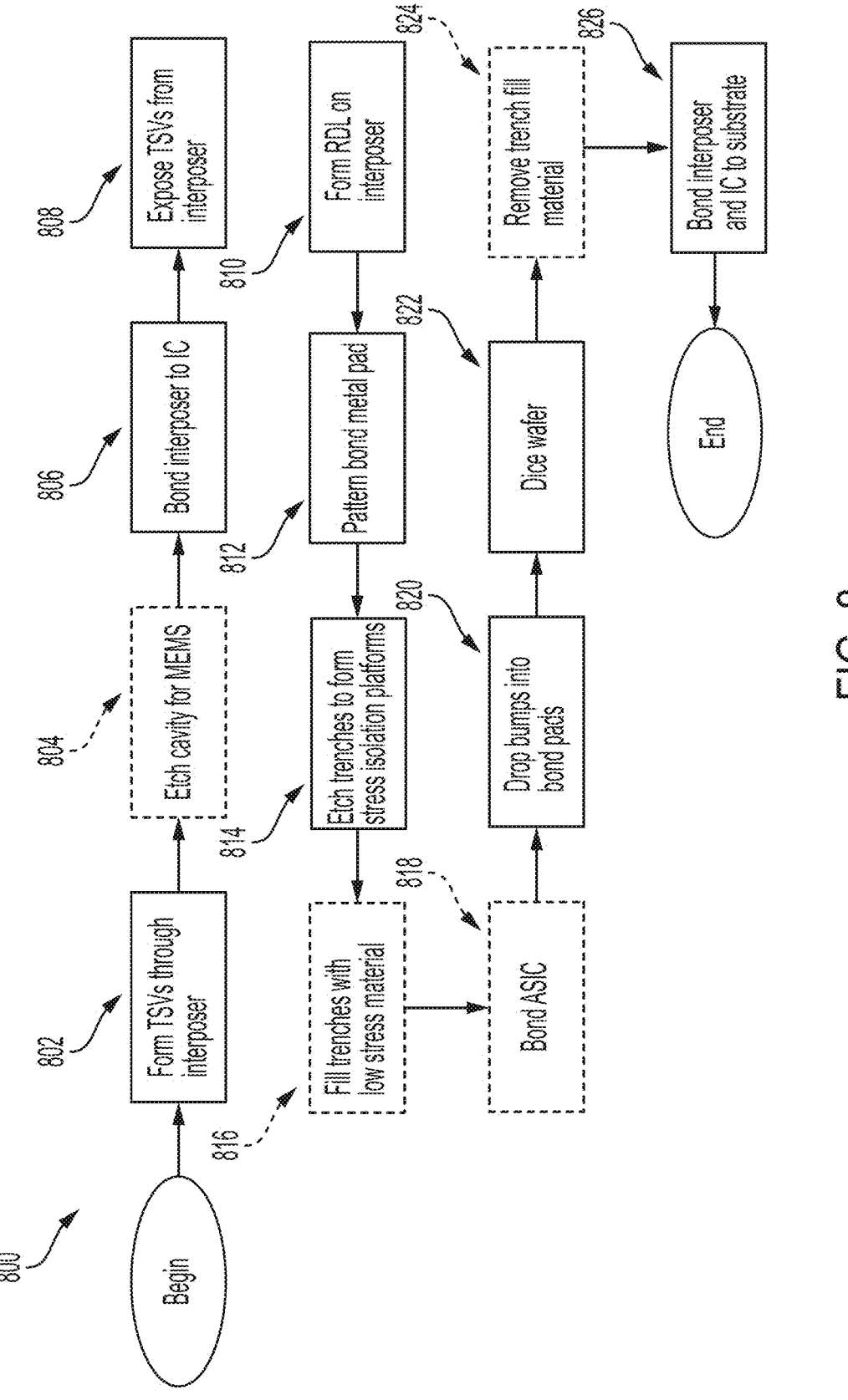
FIG. 8 illustrates a flowchart representing a method for fabricating a 3D heterogenous packaged, according to a non-limiting embodiment of the present application.

Aspects of the present application provide methods for fabricating stress isolated 3D heterogeneous packaged devices. An example of such a method is illustrated in FIG. 8, according to a non-limiting embodiment of the present application. The steps of method 800 may be performed in accordance with the order illustrated in FIG. 8, or in any other suitable order. Any of the apparatuses described herein may be fabricated using method 800, including packages having MEMS devices.

At step 802, thru silicon vias (TSVs) are formed through an interposer. The interposer may be a passive interposer in some embodiments (e.g., lacking transistors). Optional step 804 may be performed in the context of MEMS devices to form a cap substrate. At this step, a cavity is etched through the interposer in correspondence with the area where a MEMS device, once bonded, will interface with the interposer. An example of such a cavity is cavity 707 of FIG. 7A. At step 806, the interposer is bonded to an IC. The IC may be a digital IC, an analog IC, a MEMS die, a sensor die (e.g., an optical die, a magnetic sensor die, a biosensor die, a microfluidics die) or a combination, among other possible device types. Bonding may be performed in some embodiments using flip-chip techniques. In embodiments in which the IC comprises a MEMS device, step 806 results in the MEMS device aligning to the cavity formed at step 804. At step 808, the interposer's TSVs are exposed to air, which may involve grinding and/or polishing the top surface of the interposer. At step 810, a redistribution layer (RDL) is formed on the interposer. The RDL may support signal routing across the interposer. At step 812, bond metal pads (e.g., pads 114 of FIG. 1A) are patterned on the interposer. At step 814, trenches (e.g., trenches 113 of FIG. 1A or 713 of FIG. 7A) are formed through the interposer in a way so that stress isolation suspensions (119 or 719) are also formed. This step results in the formation of stress isolation platforms. Optional step 816 involves filling the trenches with gel or other low stress material to improve the mechanical strength of the stress isolation platforms during some of the subsequent fabrication steps. Optional step 818 may be performed in the context of MEMS devices, and involves bonding an ASIC to the MEMS die. At step 820, bumps are dropped onto the bond pads. At step 822, the interposer wafer is diced. Optional step 824 involves removing the gel or other low stress material from the trenches. Lastly, at step 826, the interposer and the IC are bonded to an underlying substrate (e.g., a laminate or a PCB).

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

As used herein, reference to a numerical value being between two endpoints should be understood to encompass the situation in which the numerical value can assume either of the endpoints. For example, stating that a characteristic has a value between A and B, or between approximately A and B, should be understood to mean that the indicated range is inclusive of the endpoints A and B unless otherwise noted.

What is claimed is:

1. A 3D heterogeneous packaged device, comprising:
a device die; and
an interposer coupled with the device die at a plurality of bond points, the interposer comprising a plurality of stress isolation platforms at different locations from the plurality of bond points, wherein a first stress isolation platform of the plurality of stress isolation platforms is flexibly coupled to the interposer by a stress isolation suspension that is formed between two or more trenches that extend across an entire thickness of the interposer.

2. The 3D heterogeneous packaged device of claim 1, wherein the first stress isolation platform of the plurality of stress isolation platforms is coupled to a remainder of the interposer at least in part by the stress isolation suspension.

3. The 3D heterogeneous packaged device of claim 1, wherein the plurality of bond points are a first plurality of bond points, and wherein the 3D heterogeneous packaged device further comprises a substrate coupled with the interposer at a second plurality of bond points aligned with the plurality of stress isolation platforms, wherein the interposer is disposed between the device die and the substrate.

4. The 3D heterogeneous packaged device of claim 3, wherein the device die is an integrated circuit die and the substrate is a printed circuit board, silicon substrate, silicon carbide substrate, silicon germanium substrate, gallium arsenide substrate, gallium nitride substrate, glass substrate, ceramic substrate, or laminate substrate.

5. The 3D heterogeneous packaged device of claim 3, wherein the device die is an integrated circuit (IC) die, a microelectromechanical systems (MEMS) die, a sensor die, an optical die, a magnetic sensor die, a biosensor die, a microfluidics die), or a combination thereof.

6. The 3D heterogeneous packaged device of claim 3, wherein the device die is a first device die, and wherein the 3D heterogeneous packaged device further comprises a second device die coupled with the first device die in a vertical stack, with the interposer representing a bottom layer of the vertical stack, the first device die positioned above the interposer as a second layer of the vertical stack, and the second device die positioned above the first device die as a third layer of the vertical stack.

7. The 3D heterogeneous packaged device of claim 1, wherein the interposer comprises an outer portion and an inner portion, and wherein the plurality of stress isolation platforms are formed only at the outer portion of the interposer.

8. A 3D heterogeneous packaged device, comprising:
a substrate;
an interposer, bonded to the substrate, comprising:
a plurality of stress isolation platforms, at least one of the plurality of stress isolation platforms defining a portion of the interposer that is flexibly coupled to a remainder of the interposer by a plurality of stress isolation suspensions; and

US 12,612,303 B2

11 a bond pad formed in the at least one of the plurality of
stress isolation platforms;
a bond, in contact with the bond pad, coupling the
interposer to the substrate; and
a device die coupled to the interposer, wherein the inter-
poser is disposed between the device die and the
substrate.

9. The 3D heterogeneous packaged device of claim 8,
wherein at least eight stress isolation suspensions flexibly
couple the at least one of the plurality of stress isolation
platforms to the remainder of the interposer.

10. The 3D heterogeneous packaged device of claim 8,
wherein at least one of the plurality of stress isolation
suspensions is formed between a pair of trenches that extend
across an entire thickness of the interposer.

11. The 3D heterogeneous packaged device of claim 8,
wherein the interposer comprises an outer portion and an
inner portion, and wherein the plurality of stress isolation
platforms are formed only at the outer portion of the
interposer.

12. The 3D heterogeneous packaged device of claim 8,
wherein the device die comprises a MEMS device and the
interposer defines a cavity aligned with the MEMS device.

13. The 3D heterogeneous packaged device of claim 8,
wherein the interposer further comprises a thru silicon via
(TSV) electrically coupling the bond pad to the device die.

14. The 3D heterogeneous packaged device of claim 8,
wherein the device die is a first device die, and wherein the
3D heterogeneous packaged device further comprises a
second device die bonded to the first device die so that the
first device die is between the interposer and the second
device die.

15. The 3D heterogeneous packaged device of claim 8,
wherein the substrate comprises a laminate substrate bonded
to a printed circuit board.

16. A method for fabricating a 3D heterogeneous pack-
aged device, comprising:
bonding an interposer to a device die;
patterning the interposer with a plurality of bond pads;
forming, at different locations from the plurality of bond
pads, a plurality of stress isolation platforms by etching
a plurality of trenches through the interposer so that at
least one of the plurality of stress isolation platforms
includes a bond pad of the plurality of bond pads; and
with the interposer bonded to the device die, bonding the
interposer to a substrate so that the interposer is
between the device die and the substrate,
wherein a first stress isolation platform of the plurality of
stress isolation platforms is flexibly coupled to the
interposer by a stress isolation suspension that is
formed between two or more trenches of the plurality
of trenches that extend across an entire thickness of the
interposer.

17. The method of claim 16, further comprising filling the
plurality of trenches with gel.

18. The method of claim 16, further comprising forming
a plurality of thru silicon vias (TSVs) through the interposer,
wherein bonding the interposer to the device die comprises
electrically coupling the device die to the TSVs.

19. The method of claim 16, wherein the device die
comprises a MEMS device, wherein the method further
comprises etching a cavity through the interposer, wherein
bonding the interposer to the device die comprises aligning
the MEMS device to the cavity.

20. The method of claim 16, wherein etching the plurality
of trenches through the interposer comprises etching the
plurality of trenches through the entire thickness of the
interposer.

* * * * *